United States Patent
Kominato et al.

(10) Patent No.: US 8,822,103 B2
(45) Date of Patent: Sep. 2, 2014

(54) MASK BLANK, TRANSFER MASK, METHOD OF MANUFACTURING A TRANSFER MASK, AND METHOD OF MANUFACTURING A SEMICONDUCTOR DEVICE

(75) Inventors: Atsushi Kominato, Tokyo (JP); Osamu Nozawa, Tokyo (JP); Hiroyuki Iwashita, Tokyo (JP); Masahiro Hashimoto, Tokyo (JP)

(73) Assignee: Hoya Corporation, Tokyo (JP)

( * ) Notice: Subject to any disclaimer, the term of this patent is extended or adjusted under 35 U.S.C. 154(b) by 152 days.

(21) Appl. No.: 13/288,365

(22) Filed: Nov. 3, 2011

(65) Prior Publication Data

US 2012/0115075 A1     May 10, 2012

(30) Foreign Application Priority Data

Nov. 5, 2010 (JP) ................... 2010-247986

(51) Int. Cl.
*G03F 1/50* (2012.01)
*G03F 1/58* (2012.01)
*G03F 1/74* (2012.01)
*G03F 7/20* (2006.01)

(52) U.S. Cl.
USPC ............ 430/4; 430/5; 430/311; 216/12

(58) Field of Classification Search
CPC ............... G03F 1/50; G03F 1/58; G03F 1/74; G03F 7/20
USPC ................... 430/4–5, 311; 216/12
See application file for complete search history.

(56) References Cited

U.S. PATENT DOCUMENTS

| 6,753,538 | B2 | 6/2004 | Musil et al. |
| 7,767,366 | B2 | 8/2010 | Yoshikawa et al. |
| 7,767,367 | B2 | 8/2010 | Yoshikawa et al. |
| 7,790,339 | B2 | 9/2010 | Yoshikawa et al. |
| 2007/0212619 | A1 * | 9/2007 | Yoshikawa et al. ........... 430/5 |

FOREIGN PATENT DOCUMENTS

| JP | 2000-10260 A | 1/2000 |
| JP | 2004-537758 A | 12/2004 |
| JP | 2007-241060 A | 9/2007 |
| JP | 2007-241065 A | 9/2007 |
| JP | 2007-292824 A | 11/2007 |

\* cited by examiner

*Primary Examiner* — Mark F Huff
*Assistant Examiner* — John S Ruggles
(74) *Attorney, Agent, or Firm* — Sughrue Mion, PLLC

(57) ABSTRACT

A mask blank for manufacturing a transfer mask adapted to be applied with ArF excimer laser exposure light that has a transparent substrate and a light-shielding film formed into a transfer pattern. The light-shielding film has at least two-layers, one a lower layer composed mainly of a first material containing a transition metal, silicon, and nitrogen, and the other an upper layer composed mainly of a second material containing a transition metal, silicon, and nitrogen. A ratio of a first etching rate of the lower layer to a second etching rate of the upper layer is 1.0 or more and 5.0 or less in etching carried out by supplying a fluorine-containing substance onto a target portion and irradiating charged particles to the target portion. Another ratio satisfies the following formula $C_N \geq -0.00526 C_{Mo}^2 - 0.640 C_{Mo} = 26.624$.

18 Claims, 3 Drawing Sheets

US 8,822,103 B2

MASK BLANK, TRANSFER MASK, METHOD OF MANUFACTURING A TRANSFER MASK, AND METHOD OF MANUFACTURING A SEMICONDUCTOR DEVICE

This application is based upon and claims the benefit of priority from Japanese patent application No. 2010-247986, filed on Nov. 5, 2010, the disclosure of which is incorporated herein in its entirety by reference.

TECHNICAL FIELD

This invention relates to a mask blank, a transfer mask, a method of manufacturing a transfer mask, and a method of manufacturing a semiconductor device. In particular, this invention relates to a mask blank for manufacturing a transfer mask to which a defect correction technique using charged particle irradiation can be suitably applied, and to a method of manufacturing such a transfer mask.

BACKGROUND ART

Generally, fine pattern formation is carried out by photolithography in the manufacture of a semiconductor device. A number of substrates called transfer masks (photomasks) are normally used for such fine pattern formation. The transfer mask comprises generally a transparent glass substrate having thereon a fine pattern made of a metal thin film or the like. The photolithography is used also in the manufacture of the transfer mask.

In the manufacture of a transfer mask by photolithography, use is made of a mask blank having a thin film (e.g. a light-shielding film) for forming a transfer pattern (mask pattern) on a transparent substrate such as a glass substrate. The manufacture of the transfer mask using the mask blank is carried out by a method comprising an exposure process of writing a required pattern on a resist film formed on the mask blank, a developing process of developing the resist film to form a resist pattern in accordance with the written pattern, an etching process of etching the thin film along the resist pattern, and a process of stripping and removing the remaining resist pattern. In the developing process, a developer is supplied after writing the required pattern on the resist film formed on the mask blank to dissolve a portion of the resist film soluble in the developer, thereby forming the resist pattern. In the etching process, using the resist pattern as a mask, an exposed portion of the thin film, where the resist pattern is not formed, is dissolved by dry etching or wet etching, thereby forming a required mask pattern on the transparent substrate. In this manner, the transfer mask is produced.

For miniaturization of a pattern of a semiconductor device, it is necessary to shorten the wavelength of exposure light for use in the photolithography in addition to the miniaturization of the mask pattern of the transfer mask. In recent years, the wavelength of exposure light for use in the manufacture of a semiconductor device has been shortened from KrF excimer laser light (wavelength: 248 nm) to ArF excimer laser light (wavelength: 193 nm).

As a type of transfer mask, apart from a conventional binary mask having a light-shielding film pattern made of a chromium-based material on a transparent substrate, there has recently appeared a binary mask using, as a light-shielding film, a material such as MoSiN containing a transition metal and silicon as main metal components and further containing nitrogen, as described in JP-A-2007-292824 (Patent Document 1).

In the meantime, hitherto, with respect to a transfer mask manufactured from a mask blank by forming a transfer pattern in a light-shielding film by dry etching using as a mask a resist pattern formed in a resist film by electron beam writing and development or an etching mask pattern formed in an etching mask film, a comparison is made, using a pattern inspection apparatus, between a design transfer pattern and the transfer pattern formed in the light-shielding film and a defect (so-called black defect) portion where the light-shielding film remains in excess as compared with the design transfer pattern is corrected by a physical treatment using nano-machining or focused ion beam (FIB) machining. However, there has been a problem that the correction of the black defect portion by such a physical treatment takes much time. Further, since the irradiation dose of Ga ions becomes large in the normal FIB machining, Ga stain remaining on a quartz substrate has been a problem. In view of this, there has been reported a technique of gas assist for enhancing the reactivity to suppress the Ga irradiation dose (see JP-A-2000-10260 (Patent Document 2)) or the like.

On the other hand, JP-A-2004-537758 (Patent Document 3) discloses a defect correction technique that supplies a xenon difluoride ($XeF_2$) gas to a black defect portion of a light-shielding film and irradiates an electron beam onto the black defect portion, thereby etching the black defect portion to remove it (hereinafter, such defect correction that is carried out by irradiating charged particles such as an electron beam while supplying a fluorine-containing substance such as a xenon difluoride gas will be referred to simply as "EB defect correction"). Such EB defect correction was at first used for correction of a black defect portion in an absorber film of a reflective mask for EUV lithography, but has started to be used also for defect correction of a MoSi-based halftone mask.

SUMMARY OF THE INVENTION

Using a binary mask blank formed with a light-shielding film of a laminated structure comprising an upper layer and a lower layer each made of a material containing a transition metal and silicon as main metal components and further containing nitrogen as disclosed in Patent Document 1, the present inventors produced a transfer mask formed with a transfer pattern in the light-shielding film, performed a defect inspection of the produced transfer mask, and performed EB defect correction of a black defect portion as disclosed in Patent Document 3, that is, performed etching of the black defect portion by supplying a $XeF_2$ gas to the black defect portion and irradiating charged particles such as an electron beam onto the black defect portion. As a result, it has been found that the following problems may occur depending on the relationship between the film compositions in the upper and lower layers of the laminated structure.

Generally, in order to suppress the surface reflection of a light-shielding film, the surface reflectance of the light-shielding film is reduced by setting the degree of oxidation or nitridation of a material of a layer on the surface side (upper layer) to be higher than that of a material of a layer on the substrate side (lower layer). On the other hand, in a binary mask blank, a light-shielding film is required to have a predetermined or higher light-shielding performance (e.g. an optical density (OD) of 2.8 or more). As the degree of oxidation or nitridation of a material increases, the light-shielding performance decreases. Due to the miniaturization of a transfer pattern in recent years, it has become necessary to use an oblique illumination method or an immersion exposure method. Following the miniaturization of the transfer pattern, the miniaturization and complication of an auxiliary pattern are remarkable. In order to cope with them, a reduction in the thickness of the light-shielding film has become necessary. Therefore, it is necessary to minimize the degree of oxidation or nitridation in the layer on the substrate side (lower layer) in order to ensure the light-shielding performance with as small a thickness as possible. On the other hand, the surface reflectance on the substrate side (back-surface reflectance) of the light-shielding film should also be suppressed to a predetermined value or less although not so low as the surface reflectance on the surface side (front-surface reflectance) of the light-shielding film, and thus, the lower layer of the light-shielding film should also be oxidized or nitrided to some extent.

The $XeF_2$ gas is known as an isotropic etching gas for silicon. Etching proceeds in processes of surface adsorption, separation into Xe and F, and production and volatilization of a high-order fluoride of silicon. However, in the case of nitrided, oxidized, or carbonized silicon such as $Si_3N_4$, $SiO_2$, SiON, or SiC, a highly volatile high-order fluoride is not easily formed so that there is a tendency of having high etching resistance to a fluorine-based gas such as a $XeF_2$ gas. In EB defect correction, the $XeF_2$ gas etching rate is significantly improved by carrying out irradiation of charged particles such as an electron beam so that selective anisotropic etching of a black defect portion is enabled. However, even in this case, as the ratio of nitrided, oxidized, or carbonized silicon in the light-shielding film increases, the etching rate tends to be lowered. Since, as described above, the upper layer of the light-shielding film is made of the material with high degree of oxidation or nitridation in order to reduce the front-surface reflectance, the etching rate difference between the upper and lower layers becomes large so that a level difference occurs. In an extreme case, a large undercut is formed.

As described above, since the upper layer of the light-shielding film is made of the material with high degree of oxidation or nitridation, the etching rate of the upper layer is lower than that of the lower layer. Therefore, it takes much time to etch the upper layer for correction of a black defect portion by EB irradiation and, thus, while etching the upper layer, the lower layer of a pattern portion adjacent to the black defect portion to be corrected (e.g. the lower layer of a pattern portion adjacent to the black defect portion of the same pattern or the lower layer of a pattern adjacent to a pattern having the black defect portion) is etched (because even the portion other than the portion irradiated with the electron beam is also placed in a state of being somewhat easily etched). As a result, the pattern side wall of the etched lower layer is retreated, while, since the EB correction etching rate of the upper layer above the retreated portion is significantly low, its pattern side wall remains as it was when it was patterned. As a consequence, a large undercut is formed also at the portion other than the black defect portion to be corrected, i.e. at the normal pattern portion.

According to the recent EB defect correction technique, using a passivation technique (supplying water, oxide-based gas, or the like) such as water passivation that lowers the etching rate by supplying water, it is possible to reduce the disadvantage even if there is some etching rate difference between the upper and lower layers of the light-shielding film. However, there is a limit to such etching rate control. Further, if the etching rate is excessively lowered, the correction time is prolonged so that the etching selectivity is reduced between the lower layer and a transparent substrate made of synthetic quartz or the like. As a consequence, there arise problems that a surface of the substrate is roughened, that etched recesses are locally formed on the substrate surface, and so on. Therefore, the laminated structure of the light-shielding film that requires the etching rate of the lower layer to be extremely lowered is not preferable.

This invention has been made in order to solve the conventional problems and has an object to provide a mask blank which enables an EB defect correction technique to be suitably applied to a transfer mask manufactured from the mask blank and which enables a reduction in the thickness of a light-shielding film, and further to provide such a transfer mask, a method of manufacturing such a transfer mask, and a method of manufacturing a semiconductor device using such a transfer mask.

The present inventors have made an intensive study on the problems which arise when the EB defect correction is applied to the black defect portion of the transfer pattern of the light-shielding film in the transfer mask manufactured from the conventional binary mask blank having the light-shielding film of the laminated structure comprising the upper and lower layers each made of the material containing the transition metal and silicon as the main metal components and further containing nitrogen.

As a result of studying various materials, the present inventors have found that, in a mask blank comprising a light-shielding film having an at least two-layer structure comprising a lower layer composed mainly of a material containing a transition metal, silicon, and nitrogen and an upper layer composed mainly of a material containing a transition metal, silicon, and nitrogen, it is possible to solve the problems which arise when the conventional EB defect correction technique is applied, and further to realize a reduction in the thickness of the light-shielding film by adjusting the ratio of the etching rate of the lower layer to that of the upper layer in EB defect correction to 1.0 or more and 5.0 or less.

Specifically, in order to solve the above-mentioned problems, this invention has the following structures.

(Structure 1)

A mask blank for manufacturing a transfer mask adapted to be applied with ArF excimer laser exposure light, comprising:
a transparent substrate; and
a light-shielding film which is formed on the transparent substrate and which is used to form a transfer pattern;
wherein the light-shielding film has an at least two-layer structure comprising a lower layer and an upper layer from a transparent substrate side,
the lower layer is composed mainly of a material containing a transition metal, silicon, and nitrogen,
the upper layer is composed mainly of a material containing a transition metal, silicon, and nitrogen, and
a ratio of an etching rate of the lower layer to an etching rate of the upper layer is 1.0 or more and 5.0 or less in etching which is carried out by supplying a fluorine-containing substance to a target portion and irradiating charged particles to the target portion.

(Structure 2)

The mask blank according to the structure 1, wherein the lower layer is substantially free of oxygen and the upper layer is substantially free of oxygen at a portion excluding a surface layer of the upper layer.

(Structure 3)

The mask blank according to the structure 1 or 2, wherein a difference between a nitrogen content in the upper layer and a nitrogen content in the lower layer is less than 30 at %.

(Structure 4)

The mask blank according to any one of the structures 1 to 3, wherein a difference between a ratio obtained by dividing a content of the transition metal in the lower layer by a total content of the transition metal and the silicon in the lower layer and a ratio obtained by dividing a content of the transition metal in the upper layer by a total content of the transition metal and the silicon in the upper layer is 4% or less.

(Structure 5)

The mask blank according to any one of the structures 1 to 4, wherein a ratio obtained by dividing a content of the transition metal in the lower layer by a total content of the transition metal and the silicon in the lower layer and a nitrogen content in the lower layer are in ranges satisfying a condition of a formula (1) given by $$C_N \geq -0.00526 C_{Mo}^2 - 0.640 C_{Mo} + 26.624$$

where $C_{Mo}$ is a ratio obtained by dividing the content of the transition metal in the lower layer by the total content of the transition metal and the silicon in the lower layer and $C_N$ is a nitrogen content in the lower layer.

(Structure 6)

The mask blank according to the structure 5, wherein the ratio obtained by dividing the content of the transition metal in the lower layer by the total content of the transition metal and the silicon in the lower layer and the nitrogen content in the lower layer are in ranges simultaneously satisfying a condition of a formula (2) given by $$C_N \leq -3.63 \times 10^{-7} C_{Mo}^5 + 7.60 \times 10^{-5} C_{Mo}^4 - 4.67 \times 10^{-3} C_{Mo}^3 + 5.06 \times 10^{-2} C_{Mo}^2 + 2.082 C_{Mo} + 1.075$$

where $C_{Mo}$ is a ratio obtained by dividing the content of the transition metal in the lower layer by the total content of the transition metal and the silicon in the lower layer and $C_N$ is a nitrogen content in the lower layer.

(Structure 7)

The mask blank according to any one of the structures 1 to 6, wherein a content of the transition metal in the upper layer is 10 at % or less.

(Structure 8)

The mask blank according to any one of the structures 1 to 7, wherein a ratio obtained by dividing a content of the transition metal in the lower layer by a total content of the transition metal and the silicon in the lower layer is 15% or less.

(Structure 9)

The mask blank according to any one of the structures 1 to 8, wherein an etching mask film is provided on an upper surface of the light-shielding film and contains chromium and at least one of nitrogen and oxygen and a chromium content in the etching mask film is 50 at % or more.

(Structure 10)

A transfer mask manufactured using the mask blank according to any one of the structures 1 to 9.

(Structure 11)

A transfer mask adapted to be applied with ArF excimer laser exposure light, comprising:

a transparent substrate; and a light-shielding film formed on the transparent substrate, the light-shielding film comprising a transfer pattern;

wherein the light-shielding film has an at least two-layer structure comprising a lower layer and an upper layer from a transparent substrate side, the lower layer is composed mainly of a material containing a transition metal, silicon, and nitrogen, the upper layer is composed mainly of a material containing a transition metal, silicon, and nitrogen, and a ratio of an etching rate of the lower layer to an etching rate of the upper layer is 1.0 or more and 5.0 or less in etching which is carried out by supplying a fluorine-containing substance to a target portion and irradiating charged particles to the target portion.

(Structure 12)

The transfer mask according to the structure 11, wherein the lower layer is substantially free of oxygen and the upper layer is substantially free of oxygen at a portion excluding a surface layer of the upper layer.

(Structure 13)

A method of manufacturing a transfer mask using the mask blank according to according to any one of the structures 1 to 9, comprising a defect correction step of making a comparison between a design transfer pattern and a transfer pattern formed in the light-shielding film and etching a defect portion, where the light-shielding film remains, by supplying a fluorine-containing substance and irradiating charged particles.

(Structure 14)

A method of manufacturing a semiconductor device, comprising forming a circuit pattern on a semiconductor wafer using the transfer mask according to the structure 11 or 12.

(Structure 15)

A method of manufacturing a semiconductor device, comprising forming a circuit pattern on a semiconductor wafer using the transfer mask manufactured by the method according to the structure 13.

According to this invention, by forming a light-shielding film into an at least two-layer structure comprising a lower layer composed mainly of a material containing a transition metal, silicon, and nitrogen and an upper layer composed mainly of a material containing a transition metal, silicon, and nitrogen and by adjusting the ratio of the etching rate of the lower layer to that of the upper layer in EB defect correction to 1.0 or more and 5.0 or less, it is possible to provide a mask blank which can solve the problems that arise when the conventional EB defect correction is applied, and which enables an EB defect correction technique to be suitably applied to black defect correction of a transfer pattern of a transfer mask manufactured from the mask blank, and further to provide such a transfer mask, a method of manufacturing such a transfer mask, and a method of manufacturing a semiconductor device using such a transfer mask.

Further, according to this invention, it is possible to provide a mask blank which can achieve an optical density of a light-shielding film, required for a binary mask, with a light-shielding film thickness of, for example, less than 65 nm and thus can solve various problems due to the miniaturization of a transfer pattern, and further to provide a transfer mask manufactured from the mask blank, a method of manufacturing such a transfer mask, and a method of manufacturing a semiconductor device using such a transfer mask.

BRIEF DESCRIPTION OF THE DRAWINGS

FIG. 3 is a diagram showing the relationship between the Mo/(Mo+Si) ratio and the nitrogen content, which satisfies the optical density per predetermined unit thickness and so on.

DETAILED DESCRIPTION OF THE INVENTION

Hereinbelow, an embodiment of this invention will be described in detail with reference to the drawings.

This invention is a mask blank for use in the manufacture of a transfer mask adapted to be applied with ArF exposure light, the mask blank comprising, on a transparent substrate, a light-shielding film for forming a transfer pattern, wherein the light-shielding film has an at least two-layer structure comprising a lower layer composed mainly of a material containing a transition metal, silicon, and nitrogen and an upper layer composed mainly of a material containing a transition metal, silicon, and nitrogen and the ratio of the etching rate of the lower layer to that of the upper layer is 1.0 or more and 5.0 or less in etching which is carried out by supplying a fluorine-containing substance to a target portion and irradiating charged particles to the target portion.

Figure 1:
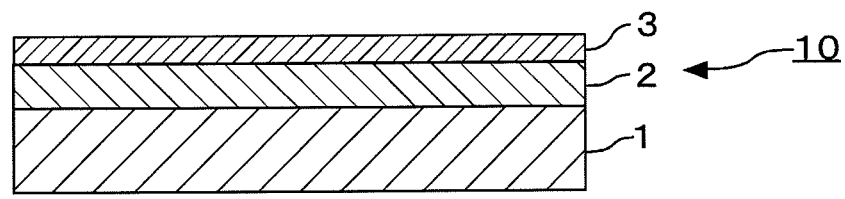
FIG. 1 is a cross-sectional view of an embodiment of a mask blank according to this invention.

FIG. 1 is a cross-sectional view of a mask blank 10 according to the embodiment of this invention. The mask blank 10 comprises a light-shielding film 2 on a transparent substrate 1. The transparent substrate 1 is not particularly limited as long as it has transparency for ArF excimer laser light. In this invention, a synthetic quartz substrate and various other glass substrates such as a $CaF_2$ substrate, a soda-lime glass substrate, an alkali-free glass substrate, and an aluminosilicate glass substrate can be used. Among them, the synthetic quartz substrate is particularly suitable for this invention because it has high transparency for ArF excimer laser light.

The light-shielding film 2 has an at least two-layer structure comprising a lower layer composed mainly of a material containing a transition metal, silicon, and nitrogen and an upper layer composed mainly of a material containing a transition metal, silicon, and nitrogen and the ratio of the etching rate of the lower layer to that of the upper layer (lower layer etching rate/upper layer etching rate) should be set to 1.0 or more in etching which is carried out by supplying a fluorine-containing substance (unexcited state) to a target portion and, in addition, by irradiating charged particles such as an electron beam to the target portion to improve the etching rate by the fluorine-containing substance, i.e. in EB defect correction. If this ratio is less than 1.0, there is a possibility that an edge portion of a transfer pattern of the upper layer is etched while etching the lower layer, thus degrading the line edge roughness. Further, there occurs a disadvantage such as a change in the optical properties of the upper layer (e.g. an increase in the front-surface reflectance of the upper layer for exposure light) due to the proceeding of etching from a surface of the upper layer to cause a film loss, i.e. to reduce the thickness of the upper layer. Further, since the upper layer is basically a film serving as a front-surface antireflection layer, there is a possibility that, as a result of a reduction in the in-plane uniformity of the front-surface reflectance, an adverse influence is exerted on pattern exposure and transfer to a resist film or the like on a semiconductor wafer using a completed transfer mask. Taking into account maintaining a better edge shape of the upper layer, it is more preferable that the ratio of the etching rate of the lower layer to that of the upper layer be 1.2 or more in the EB defect correction.

In this invention, the ratio of the etching rate of the lower layer to that of the upper layer should be 5.0 or less in the EB defect correction. If this ratio is greater than 5.0, the etching rate of the upper layer becomes significantly lower than that of the lower layer in the EB defect correction. If it takes much time to etch the upper layer for correction of a black defect portion by EB irradiation, the lower layer of a pattern portion adjacent to the black defect (e.g. the lower layer of a pattern portion adjacent to the black defect portion of the same pattern or the lower layer of a pattern adjacent to a pattern having the black defect portion), which is not a little affected by the EB irradiation, tends to be etched. As a consequence, a side wall of the lower layer of that pattern portion is largely retreated from an expected position so that there occurs a state where the lower layer is laterally retreated as compared with the upper layer (undercut).

In the meantime, the etching rate of each of the upper and lower layers in the EB defect correction tends to be lowered as the content of oxygen or nitrogen in the layer increases. That is, the etching rate of each of the upper and lower layers in the EB defect correction is largely affected by the content of oxygen or nitrogen in the layer.

In particular, the etching rate in the EB defect correction is significantly lowered in the case where oxygen is contained as compared with the case where nitrogen is contained. However, conventionally, use is often made of a material containing oxygen as an upper layer of a light-shielding film. In general, the upper layer of the light-shielding film serves to reduce the reflection (front-surface reflectance) when part of exposure light reflected by lenses of a reduction optical system impinges on a surface of the light-shielding film. In order to reduce the front-surface reflectance of the light-shielding film, oxygen is often contained in the material forming the upper layer. This is because the transmittance of the material for the exposure light can be easily increased by containing oxygen.

On the other hand, in order to achieve a predetermined or higher light-shielding performance (e.g. an optical density (OD) of 2.8 or more) over the entire light-shielding film with a small total thickness (less than 65 nm), it is necessary to select a material with high light-shielding performance as a lower layer of the light-shielding film. Therefore, it is necessary to avoid as much as possible containing oxygen, which has a property of increasing the transmittance (a property of largely reducing the light-shielding performance), in the lower layer. In order to set the ratio of the etching rate of the lower layer to that of the upper layer to 5.0 or less, the contents of nitrogen and oxygen (particularly the contents of oxygen) in the upper layer and the lower layer may be adjusted to be as close to each other as possible, which, however, is difficult due to the above-mentioned restrictions required for the light-shielding film.

Accordingly, in this invention, each of the upper and lower layers is composed mainly of the material containing the transition metal, silicon, and nitrogen and is prevented as much as possible from containing oxygen. Further, by containing more nitrogen in the upper layer than in the lower layer, the ratio of the etching rate of the lower layer to that of the upper layer can be adjusted to 5.0 or less while the front-surface reflectance of the upper layer is maintained at a predetermined value or less (e.g. 30% or less).

Further, in this invention, by configuring such that the lower layer is substantially free of oxygen and that the upper layer is substantially free of oxygen at its portion other than its surface layer where oxidation is unavoidable, the ratio of the etching rate of the lower layer to that of the upper layer can be adjusted to be smaller (e.g. 4.0 or less and, further, 3.0 or less) and, further, the total thickness of the light-shielding film can be made smaller (e.g. 60 nm or less). The reason for this is that when oxygen is contained in the material of the upper layer, the etching rate in the EB defect correction is significantly lowered as compared with the case where nitrogen is contained. This is a fact found by the present inventors as a result of carrying out various tests and studies.

Therefore, according to this invention, it is possible to prevent that it takes much time to etch the upper layer in EB defect correction due to the too-small etching rate of the upper layer and thus that while etching the upper layer, the lower layer of a pattern portion adjacent to a black defect portion to be corrected (e.g. the lower layer of a pattern portion adjacent to the black defect portion of the same pattern or the lower layer of a pattern adjacent to a pattern having the black defect portion) is etched. As a consequence, it is possible to prevent that a large undercut is formed at the portion other than the black defect portion to be corrected, i.e. at the normal pattern portion. The structure of the light-shielding film of this invention is effective particularly at a portion where the distance between patterns is small. For example, the effect is remarkable in the case where a black defect to be corrected is present in a line & space (L&S) line pattern.

As described above, it is preferable that, of the upper and lower layers forming the light-shielding film 2, the lower layer be substantially free of oxygen and the upper layer be substantially free of oxygen at its portion other than its surface layer. Herein, "substantially free of oxygen" represents that oxygen is positively prevented from being contained. Specifically, "substantially free of oxygen" includes the case where oxygen is inevitably contained due to contamination or the like and represents that the oxygen content is 5 at % or less.

The upper layer is substantially free of oxygen at its portion other than its surface layer and thus may contain oxygen at its surface layer portion. Normally, after forming the light-shielding film 2, the surface of the light-shielding film 2 is cleaned. In this event, the surface layer of the light-shielding film 2 (i.e. the surface layer of the upper layer) is unavoidably oxidized. Further, after forming the light-shielding film 2 on the transparent substrate 1, there is a case where, in order to reduce the film stress of the light-shielding film 2, the light-shielding film 2 is heat-treated (annealed) at a temperature of, for example, 450° C. in the atmosphere. In this annealing, the surface layer portion of the upper layer is inevitably bonded to oxygen in the atmosphere, i.e. is oxidized. The thickness of the upper layer to be oxidized is a maximum of 3 nm and is preferably 2 nm or less.

In order to set the ratio of the etching rate of the lower layer to that of the upper layer to 1.0 or more and 5.0 or less, the contents of the transition metal, silicon, and nitrogen in the upper layer and the lower layer should be adjusted to be as close to each other as possible. Accordingly, the difference between the ratio obtained by dividing the content of the transition metal in the lower layer by the total content of the transition metal and silicon in the lower layer and the ratio obtained by dividing the content of the transition metal in the upper layer by the total content of the transition metal and silicon in the upper layer is preferably 4% or less, more preferably 3% or less, and further preferably 2% or less. Further, the difference between the nitrogen content in the upper layer and the nitrogen content in the lower layer is preferably less than 30 at %, more preferably 25 at % or less, and further preferably 20 at % or less. By making the compositions of the materials of the upper and lower layers as close to each other as possible as described above, the ratio of the etching rate of the lower layer to that of the upper layer can be adjusted to 1.0 or more and 5.0 or less in the EB defect correction.

Figure 3:
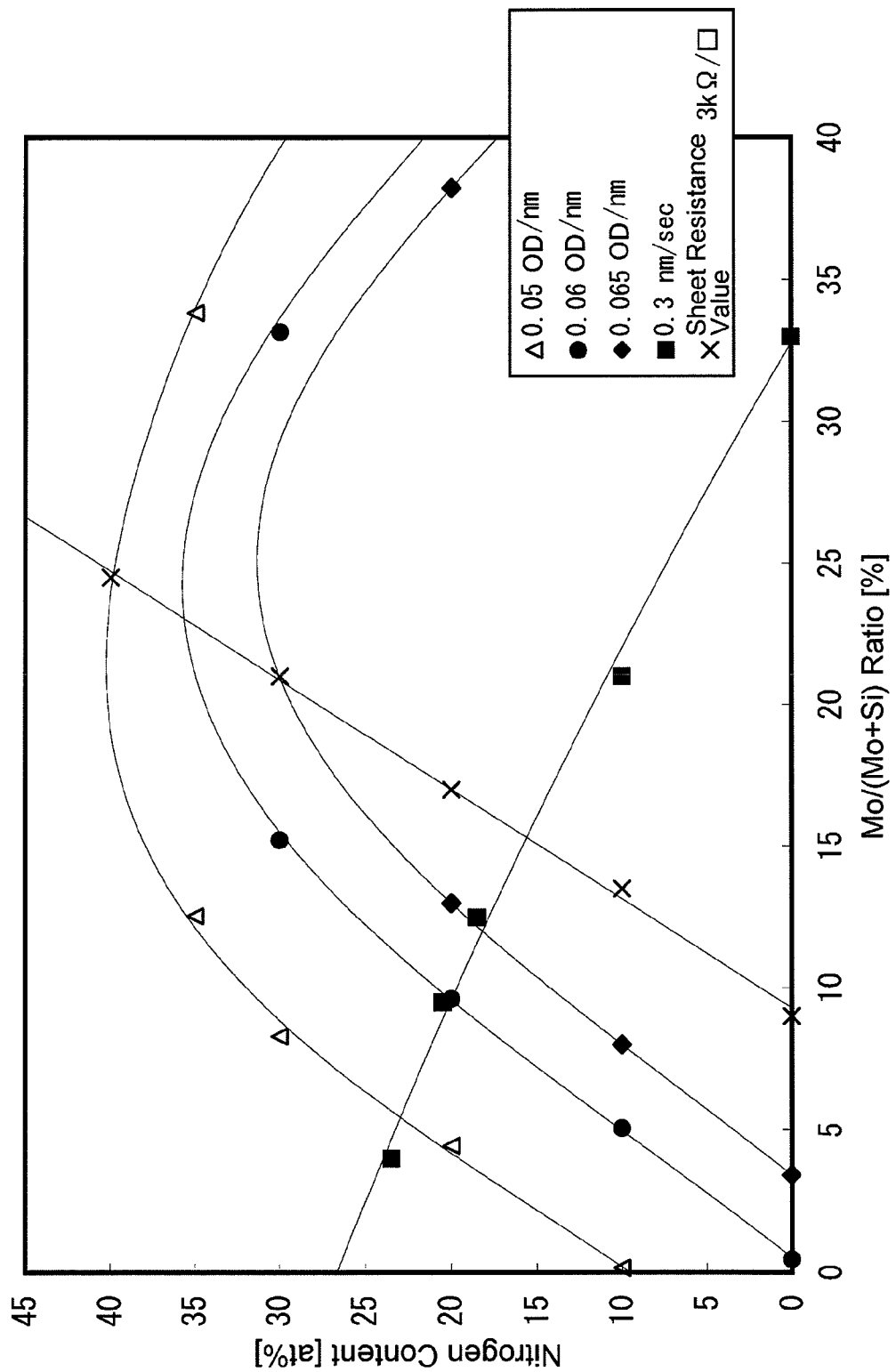

Taking into account only the light-shielding performance, the nitrogen content in the lower layer is preferably low. However, the EB defect correction should also be taken into account so that nitrogen should be contained in a predetermined amount or more. FIG. 3 is a graph showing a range where the etching rate, with respect to a fluorine-containing substance, of a thin film (a lower or upper layer of a light-shielding film) made of a material containing molybdenum, silicon, and nitrogen becomes 0.3 nm/sec or less in the state where the thin film is not irradiated with charged particles such as an electron beam. In the graph of FIG. 3, the abscissa axis represents the ratio obtained by dividing the molybdenum content [at %] in the thin film by the molybdenum and silicon total content [at %] in the thin film (i.e. the ratio, given in percent [%], of the molybdenum content [at %] in the thin film when the molybdenum and silicon total content [at %] in the thin film is given as 100; hereinafter referred to as a "Mo/(Mo+Si) ratio"). In the graph of FIG. 3, the ordinate axis represents the nitrogen content [at %] in the thin film. In FIG. 3, the etching rate, with respect to the fluorine-containing substance, of the thin film with the Mo/(Mo+Si) ratio and the nitrogen content in a graph region above an approximate curve of "■0.3 nm/sec" plots becomes 0.3 nm/sec or less in the state where the thin film is not irradiated with charged particles.

While carrying out EB defect correction of a black defect portion, the fluorine-containing substance in a gaseous state is supplied to the black defect portion. Therefore, the gas of the fluorine-containing substance spreads centering around the black defect portion to be brought into contact with a nearby pattern side wall of the thin film. Even if not irradiated with charged particles, the thin film is etched by the gas of the fluorine-containing substance. In this event, if the etching rate, with respect to the fluorine-containing substance, of the thin film is greater than 0.3 nm/sec in the state where the thin film is not irradiated with charged particles, there is a possibility that the pattern side wall is etched while the EB defect correction of the black defect portion is carried out. The upper layer serves to reduce the front-surface reflectance and thus contains much nitrogen. Therefore, basically, the nitrogen content in the upper layer is in the range where the etching rate, with respect to the fluorine-containing substance, of the upper layer is 0.3 nm/sec or less in the state where the upper layer is not irradiated with charged particles.

On the other hand, the nitrogen content in the lower layer is not necessarily in the range where the etching rate, with respect to the fluorine-containing substance, of the lower layer is 0.3 nm/sec or less in the state where the lower layer is not irradiated with charged particles. Accordingly, it is necessary to adjust the nitrogen content in the lower layer so as to fall in the range where the etching rate, with respect to the fluorine-containing substance, of the lower layer is 0.3 nm/sec or less in the state where the lower layer is not irradiated with charged particles. In order to set the etching rate, with respect to the fluorine-containing substance, of the lower layer to 0.3 nm/sec or less regardless of the Mo/(Mo+Si) ratio in the lower layer in the state where the lower layer is not irradiated with charged particles, the nitrogen content in the lower layer should be adjusted to 27 at % or more. An approximate curve formula of the range where the etching rate, with respect to the fluorine-containing substance, of the thin film is 0.3 nm/sec or less in the state where the thin film is not irradiated with charged particles in FIG. 3 is, for example, $C_N = -0.00526 C_{Mo}^2 - 0.640 C_{Mo} + 26.624$, where $C_{Mo}$ is the Mo/(Mo+Si) ratio in the thin film and $C_N$ is the nitrogen content in the thin film. This approximate curve formula is calculated based on five plots in FIG. 3 and thus more or less changes depending on a calculation method. However, the influence upon etching rates due to the movement of boundary lines of composition ratios satisfying certain etching rates caused by such a change of the approximate curve formula is small in an allowable range.

The light-shielding performance (optical density) required for the light-shielding film 2 should be substantially ensured by the lower layer. In order to ensure most of the optical density of the entire light-shielding film 2 by the lower layer, the optical density (OD) per unit thickness of the material of the lower layer is required to be 0.05 nm$^{-1}$ (wavelength: 193 nm) or more. It is preferably 0.06 nm$^{-1}$ (wavelength: 193 nm) or more and more preferably 0.065 nm$^{-1}$ (wavelength: 193 nm) or more. FIG. 3 shows approximate curves obtained by plotting the Mo/(Mo+Si) ratios and the nitrogen contents of light-shielding films (lower layers) whose optical densities per unit thickness are predetermined values (0.05 nm$^{-1}$, 0.06 nm$^{-1}$, 0.065 nm$^{-1}$). In FIG. 3, for example, a region below and including the 0.05 nm$^{-1}$ approximate curve (approximate curve of "Δ0.05 OD/nm" plots) represents a composition range where a light-shielding film (lower layer) with an optical density of 0.05 nm$^{-1}$ or more per unit thickness can be formed. This approximate curve formula is, for example, $C_N = 2.97 \times 10^{-8} C_{Mo}^6 - 5.22 \times 10^{-6} C_{Mo}^5 + 3.39 \times 10^{-4} C_{Mo}^4 - 9.35 \times 10^{-3} C_{Mo}^3 + 4.19 \times 10^{-2} C_{Mo}^2 + 2.470 C_{Mo} + 9.531$.

With respect to the Mo/(Mo+Si) ratio and the nitrogen content that can form a light-shielding film (lower layer) with an optical density of 0.06 nm$^{-1}$ or more per unit thickness, it is necessary to satisfy the condition of a composition range in a region below and including the 0.06 nm$^{-1}$ approximate curve (approximate curve of "●0.06 OD/nm" plots) shown in FIG. 3. This approximate curve formula is, for example, $C_N = -3.63 \times 10^{-7} C_{Mo}^5 + 7.60 \times 10^{-5} C_{Mo}^4 - 4.67 \times 10^{-3} C_{Mo}^3 + 5.06 \times 10^{-2} C_{Mo}^2 + 2.082 C_{Mo} + 1.075$. Further, with respect to the Mo/(Mo+Si) ratio and the nitrogen content that can form a light-shielding film (lower layer) with an optical density of 0.065 nm$^{-1}$ or more per unit thickness, it is necessary to satisfy the condition of a composition range in a region below and including the 0.065 nm$^{-1}$ approximate curve (approximate curve of "♦0.065 OD/nm" plots) shown in FIG. 3. This approximate curve formula is, for example, $C_N = -3.0 \times 10^{-7} C_{Mo}^5 + 7.0 \times 10^{-5} C_{Mo}^4 - 5.0 \times 10^{-3} C_{Mo}^3 + 8.2 \times 10^{-2} C_{Mo}^2 + 1.722 C_{Mo} - 6.621$. These approximate curve formulas are each calculated based on five plots in FIG. 3 and thus more or less change depending on a calculation method. However, the influence upon optical densities due to the movement of boundary lines of composition ratios satisfying certain optical densities caused by such a change of the approximate curve formula is small in an allowable range.

From the corresponding approximate curve in FIG. 3, it is seen that, in order to form the light-shielding film (lower layer) with the optical density of 0.05 nm$^{-1}$ or more per unit thickness, the nitrogen content should be 40 at % or less. Further, in order to simultaneously satisfy the condition where the etching rate, with respect to the fluorine-containing substance, of the light-shielding film (lower layer) becomes 0.3 nm/sec or less in the state where the light-shielding film (lower layer) is not irradiated with charged particles, the Mo/(Mo+Si) ratio should be 6% or more. It is seen that, in order to form the light-shielding film (lower layer) with the optical density of 0.06 nm$^{-1}$ or more per unit thickness, the nitrogen content should be 35 at % or less. Further, in order to simultaneously satisfy the condition where the etching rate, with respect to the fluorine-containing substance, of the light-shielding film (lower layer) becomes 0.3 nm/sec or less in the state where the light-shielding film (lower layer) is not irradiated with charged particles, the Mo/(Mo+Si) ratio should be 9% or more. It is seen that, in order to form the light-shielding film (lower layer) with the optical density of 0.065 nm$^{-1}$ or more per unit thickness, the nitrogen content should be 30 at % or less. Further, in order to simultaneously satisfy the condition where the etching rate, with respect to the fluorine-containing substance, of the light-shielding film (lower layer) becomes 0.3 nm/sec or less in the state where the light-shielding film (lower layer) is not irradiated with charged particles, the Mo/(Mo+Si) ratio should be 12% or more. The upper limit of the Mo/(Mo+Si) ratio is preferably 40% or less. This is because if more molybdenum is contained, there arises a problem that the chemical resistance and the cleaning resistance are degraded.

As the transition metal contained in the material of the lower layer, use can be made of molybdenum, tantalum, tungsten, titanium, chromium, hafnium, nickel, vanadium, zirconium, ruthenium, rhodium, niobium, palladium, or the like. With respect to the ratio obtained by dividing the transition metal content [at %] in the lower layer by the transition metal and silicon total content [at %] in the lower layer (i.e. the ratio, given in percent [%], of the transition metal content [at %] in the lower layer when the transition metal and silicon total content [at %] in the lower layer is given as 100; hereinafter referred to as a "M/(M+Si) ratio" where M is a transition metal), the description has been given of molybdenum in the above-mentioned example, but approximately the same tendency is shown for the other listed transition metals.

The total thickness of the light-shielding film 2 is preferably suppressed to less than 65 nm. This makes it possible to suppress a bias due to an EMF effect. Herein, the EMF effect is the electromagnetic field effect which occurs when the thickness of the light-shielding film is large. If a bias due to the EMF effect is large, it seriously affects the CD accuracy of the line width of a transfer pattern onto a resist on a semiconductor wafer. In order to set the total thickness of the light-shielding film 2 to less than 65 nm, the optical density of the lower layer per unit thickness should be set to 0.05 nm$^{-1}$ or more and is preferably set to 0.06 nm$^{-1}$ or more and more preferably 0.065 nm$^{-1}$ or more.

As the fluorine-containing substance which is supplied to the target portion (black defect portion) in the EB defect correction, use can be made of $XeF_2$, $XeF_4$, $XeF_6$, $XeOF_2$, $XeOF_4$, $XeO_2F_2$, $XeO_3F_2$, $XeO_2F_4$, $XeO_2F_4$, $ClF_3$, $ClF$, $BrF_5$, $BrF$, $IF_3$, $IF_5$, $KrF$, $ArF$, or the like. Among them, $XeF_2$ is preferable. The fluorine-containing substance is preferably supplied in a gaseous state to the target portion.

According to the mask blank of this invention, in the light-shielding film, the ratio of the etching rate of the lower layer to that of the upper layer in the EB defect correction is set to as small as 5.0 or less. Therefore, it is possible to suppress the formation of an undercut without basically using the passivation technique that lowers the etching rate of a lower layer by supplying an adequate amount of water or oxide-based gas to a target portion, to be removed, in EB defect correction. With the passivation technique, the range where the etching rate can be lowered is limited. Further, since the etching rate of the lower layer is reduced relative to that of an upper layer, there is a case where defect correction takes much time to degrade the manufacturing throughput so that the merit over the correction by the physical treatment cannot be obtained. Further, if water is excessively supplied, there is a possibility that hydrogen after separation of oxygen from the water is bonded to fluorine separated from a fluorine-based gas such as a $XeF_2$ gas to form hydrofluoric acid, thereby dissolving the upper layer or a substrate. Depending on a state of a black defect of the light-shielding film, it may be judged at the time of EB defect correction whether or not the passivation technique is used.

In a thin film containing a transition metal and silicon, the tendencies of the change in etching rate with respect to the oxygen or nitrogen content in the thin film differ between the case of etching for EB defect correction and the case of etching by a fluorine-based gas in a plasma state, i.e. normal dry etching. In the case of the EB defect correction, as the oxygen or nitrogen content in the thin film increases, i.e. the silicon oxide or nitride content in the thin film increases, the etching rate tends to be lowered. On the other hand, in the case of the normal dry etching by the fluorine-based gas plasma, even if the oxygen or nitrogen content in the thin film increases, the etching rate does not substantially change or the etching rate tends to increase depending on the transition metal content. Therefore, the tendency of the etching rate in the case of the dry etching by the fluorine-based gas in the excited state (plasma state) for the thin film containing the transition metal and silicon hardly serves as reference for adjusting the etching rate in the EB defect correction which irradiates charged particles while supplying a fluorine-based gas in an unexcited state.

While the upper layer (front-surface antireflection layer) of the light-shielding film 2 is composed mainly of the material containing the transition metal, silicon, and nitrogen, the nitrogen content in the upper layer is preferably 30 at % or more in order to set the front-surface reflectance of the light-shielding film 2 to a predetermined value or less (e.g. 30% or less). In terms of reducing the thickness of the entire light-shielding film 2, the nitrogen content in the upper layer is preferably 60 at % or less. In order to reduce the front-surface reflectance while reducing the thickness of the entire light-shielding film 2, it is preferable to employ a film structure which utilizes an optical interference effect. Utilizing the optical interference effect is to cause interference between exposure light reflected by the interface between the upper layer and air and exposure light transmitted through the interface between the upper layer and the air and reflected by the interface between the upper layer and the lower layer to attenuate them, thereby reducing the reflection from the surface of the light-shielding film 2. In order to produce this optical interference effect, it is at least necessary that the composition in the interface vicinity in the upper layer on the lower layer side and the composition in the interface vicinity in the lower layer on the upper layer side differ from each other. Further, in order to utilize this optical interference effect, it is preferable that the composition gradient in the upper layer at its portion other than its surface layer be small in its thickness direction and it is more preferable that there be no composition gradient other than that due to a film forming process factor. The composition gradient in the upper layer at its portion other than its surface layer is preferably 4% or less, more preferably 3% or less, and further preferably 2% or less in terms of the ratio obtained by dividing the transition metal content by the transition metal and silicon total content.

As the transition metal contained in the material of the upper layer, use can be made of molybdenum, tantalum, tungsten, titanium, chromium, hafnium, nickel, vanadium, zirconium, ruthenium, rhodium, or the like. Among them, molybdenum is preferable. The transition metal content in the upper layer is preferably 10 at % or less. If the transition metal content in the upper layer is greater than 10 at %, when a transfer mask is manufactured from this mask blank, the resistance to mask cleaning (alkaline cleaning with an ammonia hydrogen peroxide mixture, or hot water cleaning) is low so that there is a possibility of the occurrence of a change in optical properties (an increase in front-surface reflectance) due to dissolution of the upper layer or a degradation in line edge roughness or CD accuracy due to a change in the shape of a transfer pattern edge portion. This tendency is particularly significant when molybdenum is used as the transition metal in the upper layer. In particular, in the case where molybdenum is used as the transition metal in the upper layer, when a heat treatment (annealing) is carried out at a high temperature for the stress control of the light-shielding film, if the transition metal content of the upper layer (front-surface antireflection layer) is high, there occurs a phenomenon that the surface is clouded white (becomes cloudy). This is considered to be because molybdenum oxide is precipitated on the surface. In order to also suppress such a phenomenon, the transition metal content of the upper layer is preferably 10 at % or less.

There is a tendency that silicon containing nitrogen or oxygen has a low conductivity (a high sheet resistance value). Therefore, in a light-shielding film containing a transition metal, silicon, and nitrogen or oxygen, it is necessary to increase the transition metal content in the film in order to increase the conductivity. In the manufacture of a transfer mask from the mask blank, as shown in FIG. 2, a resist film 4 is coated on the light-shielding film 2 (on an etching mask film 3), a design pattern is exposed and transferred to the resist film 4, and then the resist film 4 is developed and cleaned, thereby forming a resist pattern 4a. In recent years, use has been made of a method which applies a resist for electron beam writing exposure to this resist film and irradiates an electron beam for writing (electron beam exposure writing), thereby exposing a design pattern.

In this electron beam writing exposure, in terms of writing position accuracy and charge-up, the thin film under the resist film 4 (in the case of the structure comprising the light-shielding film 2 and the etching mask film 3, at least one of the light-shielding film 2 and the etching mask film 3) is required to be conductive. Specifically, it is desired that the sheet resistance value of at least one of the light-shielding film 2 and the etching mask film 3 be 3 kΩ/square or less.

The optical density of a light-shielding film for use in a binary mask blank should be 2.3 or more and is preferably 2.5 or more. However, in the case of a binary mask blank for producing a binary transfer mask for use in the double exposure technique or the like, if the optical density of a light-shielding film is as low as only 2.3 or 2.5, there may arise a problem due to leakage light at overlapping exposure portions of a resist on a wafer. Taking this into account, the optical density of the light-shielding film is preferably 2.8 or more and more preferably 3.0 or more.

On the other hand, in the DRAM hp32 nm and subsequent generations according to the lithography applied with ArF exposure light of this invention, the line width of an auxiliary pattern such as SRAF (sub-resolution assist features) of a transfer pattern to be formed in a light-shielding film becomes as extremely narrow as about 40 nm. Even if the etching mask film 3 is used, the aspect ratio of the resist film 4 at its portion formed with an auxiliary pattern tends to be high. Therefore, the thickness of the light-shielding film 2 is preferably set to less than 65 nm and more preferably 60 nm or less. That is, the light-shielding film 2 preferably ensures a predetermined optical density with the total thickness of the upper and lower layers of less than 65 nm and more preferably 60 nm or less.

Taking into account the above-mentioned problem of the thickness of the resist film 4, the thickness of the entire light-shielding film 2 is preferably less than 65 nm and, since the optical density required for the light-shielding film 2 should be ensured mainly by the lower layer (light-shielding layer), the thickness of the upper layer is preferably 20 nm or less. Taking into account the required low reflectivity and the desirable thickness (60 nm or less) of the entire light-shielding film 2, the thickness of the upper layer is more preferably 7 nm or more and 15 nm or less.

The light-shielding film of this invention is required to have the at least two-layer structure comprising the upper layer and the lower layer, and may have a laminated structure of three layers or more. For example, in the case of a three-layer structure comprising a lowermost layer, an intermediate layer, and an uppermost layer, the upper layer of this invention may be applied to the uppermost layer and the lower layer of this invention may be applied to the intermediate layer, thereby applying the relationship between the upper layer and the lower layer of this invention to the relationship between the uppermost layer and the intermediate layer. Alternatively, the upper layer of this invention may be applied to the intermediate layer and the lower layer of this invention may be applied to the lowermost layer, thereby applying the relationship between the upper layer and the lower layer of this invention to the relationship between the intermediate layer and the lowermost layer.

This invention also provides a method of manufacturing a transfer mask, comprising an etching process of patterning, by etching, the light-shielding film in the mask blank obtained by this invention and a defect correction process of correcting a black defect portion using the EB defect correction technique. As the etching in this case, dry etching effective for forming a fine pattern is preferably used.

As shown in FIG. 1, the mask blank according to this invention may also be the mask blank 10 having the light-shielding film 2 on the transparent substrate 1 and further having the etching mask film 3 on the light-shielding film 2.

In this invention, in order to ensure etching selectivity to the light-shielding film 2 in dry etching for patterning the light-shielding film 2 to form a transfer pattern, the etching mask film 3 is preferably made of, for example, a material containing chromium and at least one of nitrogen and oxygen. By providing such an etching mask film 3 on the light-shielding film 2, it is possible to achieve a reduction in the thickness of a resist film to be formed on the mask blank. The etching mask film 3 may further contain a component such as carbon. Specifically, for example, use can be made of a material such as CrN, CrON, CrOC, or CrOCN.

In recent years, use has been made of a method which applies a resist for electron beam writing exposure to the resist film 4 and irradiates an electron beam for writing (electron beam exposure writing), thereby exposing a design pattern. In this electron beam writing exposure, in terms of writing position accuracy and charge-up, at least one of the light-shielding film 2 and the etching mask film 3 is required to have a certain or higher conductivity. Specifically, it is desired that the sheet resistance value of at least one of the light-shielding film 2 and the etching mask film 3 be 3 kΩ/square or less. FIG. 3 shows an approximate straight line (approximate straight line of "×Sheet Resistance Value 3 kΩ/□" plots) obtained by plotting the Mo/(Mo+Si) ratios and the nitrogen contents of light-shielding films (lower layers) whose sheet resistance values are 3 kΩ/square or less. This approximate straight line formula is, for example, $C_N=2.593C_{Mo}-24.074$. In FIG. 3, a region on the right side of the approximate straight line represents a composition range where a light-shielding film (lower layer) with a sheet resistance value of 3 kΩ/square or less can be formed.

When the sheet resistance value of the light-shielding film 2 is 3 kΩ/square or less, even if the sheet resistance value of the etching mask film 3 is high, electron beam writing can be carried out without causing charge-up. In order to reduce the thickness of the resist film 4, it is desirable to improve the etching rate, in dry etching, of the etching mask film 3 with respect to a mixed gas of chlorine and oxygen. For this, the metal component (chromium) content is preferably set to less than 50 at %, more preferably 45 at % or less, and further preferably 40 at % or less.

On the other hand, when the sheet resistance value of the light-shielding film 2 is greater than 3 kΩ/square, the sheet resistance value of the etching mask film 3 should be set to 3 kΩ/square or less. In this case, when the etching mask film 3 has a single-layer structure, the chromium content in the etching mask film 3 is preferably 50 at % or more and more preferably 60 at % or more. When the etching mask film 3 has a laminated structure of a plurality of layers, the chromium content of at least the layer on the side to be in contact with the resist film 4 is preferably set to 50 at % or more (more preferably 60 at % or more) while the chromium content of the layer on the light-shielding film 2 side is preferably set to less than 50 at % (more preferably 45 at % or less and further preferably 40 at % or less). Furthermore, the etching mask film 3 may have a composition gradient structure in which the chromium content increases from the light-shielding film 2 side towards the side to be in contact with the resist film 4 (except a surface layer to be in contact with the resist film 4 where the chromium content is inevitably decreased due to surface oxidation). In this case, it is desired that the etching mask film 3 has a smallest chromium content of less than 50 at % (preferably 45 at % or less, more preferably 40 at % or less) and a greatest chromium content of 50 at % or more (preferably 60 at % or more).

The thickness of the etching mask film 3 is preferably 5 nm or more and 20 nm or less. If the thickness is less than 5 nm, the film loss of the etching mask film 3 proceeds in a pattern edge direction before completion of dry etching of the light-shielding film 2 using an etching mask film pattern as a mask so that there is a possibility that the CD accuracy of a pattern transferred to the light-shielding film 2 with respect to a design pattern is largely degraded. On the other hand, if the thickness is greater than 20 nm, the resist film thickness required for transferring a design pattern to the etching mask film 3 becomes large so that it is difficult to accurately transfer a fine pattern to the etching mask film 3.

Hereinbelow, the embodiment of this invention will be described in further detail with reference to an Example. In addition, a Comparative Example with respect to the Example will also be described.

EXAMPLE

In a single-wafer sputtering apparatus, using a mixed target of molybdenum (Mo) and silicon (Si) (at % ratio Mo:Si=13:87) as a sputtering target, reactive sputtering (DC sputtering) was carried out in a mixed gas atmosphere of argon and nitrogen, thereby forming a MoSiN film (lower layer (light-shielding layer)) to a thickness of 47 nm on a transparent substrate 1 made of synthetic quartz glass. Then, using a Mo/Si target (at % ratio Mo:Si=13:87), reactive sputtering (DC sputtering) was carried out in a mixed gas atmosphere of argon and nitrogen, thereby forming a MoSiN film (upper layer (front-surface antireflection layer)) to a thickness of 13 nm on the lower MoSiN film. In this manner, there was formed a light-shielding film 2 (total thickness: 60 nm) for ArF excimer laser light (wavelength: 193 nm) having a laminated structure. As illustrated only in FIG. 2A, but as applicable to the structure of the light shielding film in FIGS. 2B-2E, the laminated layer comprises a lower layer 2.1 (composition ratio Mo: 9.9 at %, Si: 66.1 at %, N: 24.0 at %) and an upper layer 2.2 (composition ratio Mo: 7.5 at %, Si: 50.5 at %, N: 42.0 at %). The elements of the respective layers of the light-shielding film 2. including lower layer 2.1 and upper layer 2.2, were analyzed by the Rutherford backscattering spectrometry.

Then, the substrate 1 with the light-shielding film 2 was heat-treated (annealed) at 450° C. for 30 minutes, thereby reducing the film stress of the light-shielding film 2.

Then, an etching mask film 3 was formed on an upper surface of the light-shielding film 2. Specifically, in a single-wafer sputtering apparatus, using a chromium (Cr) target, reactive sputtering (DC sputtering) was carried out in a mixed gas atmosphere of argon and nitrogen, thereby forming a CrN film (composition ratio Cr: 75.3 at %, N: 24.7 at %) to a thickness of 5 nm. Further, the etching mask film 3 (CrN film) was annealed at a temperature lower than the annealing temperature of the light-shielding film 2, thereby adjusting the film stress of the etching mask film 3 to be as small as possible (preferably, substantially zero) without affecting the film stress of the light-shielding film 2. In the manner described above, a binary mask blank 10 was obtained.

Then, a binary transfer mask was manufactured using the mask blank 10 manufactured as described above. FIGS. 2A to 2F show manufacturing processes thereof.

Figure 2A:
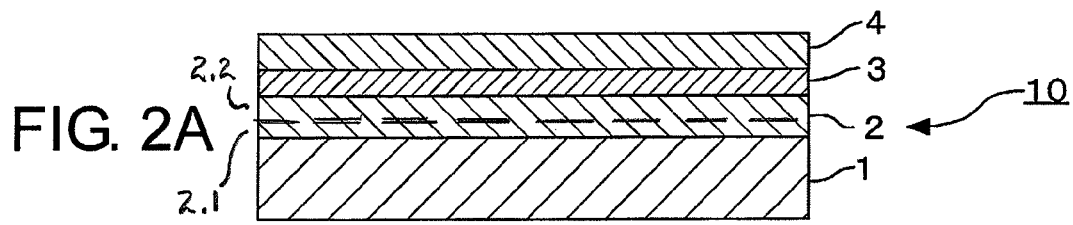
FIGS. 2A to 2F are cross-sectional views showing processes of manufacturing a transfer mask using a mask blank of an Example of this invention.
Figure 2B:
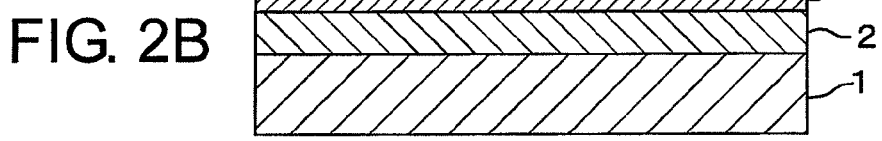

First, a chemically amplified positive resist for electron beam writing (PRL009: manufactured by FUJIFILM Electronic Materials Co., Ltd.) was coated on the mask blank 10 to form a resist film 4 (see FIG. 2A).

Figure 2C:
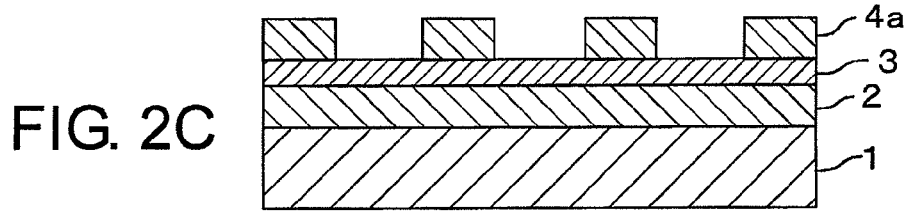

Then, using an electron beam writing apparatus, a desired pattern (a circuit pattern including a L&S pattern of DRAM half-pitch (hp) 45 nm) was written on the resist film 4 (see FIG. 2B) and, thereafter, the resist film 4 was developed with a predetermined developer, thereby forming a resist pattern 4a (see FIG. 2C). In this event, in order to carry out verification of EB defect correction, a program defect portion (a portion to be a black defect) was included in advance in the pattern writing.

Figure 2D:
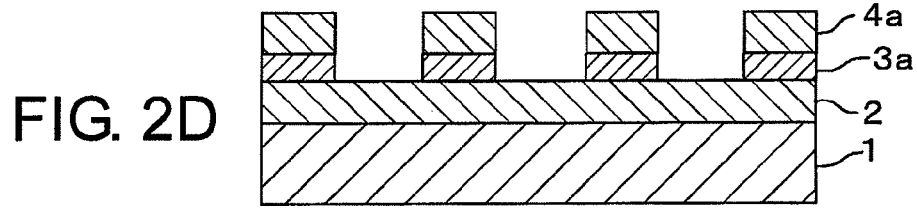
Figure 2E:
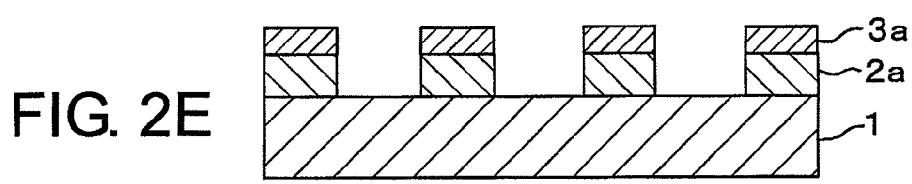

Then, using the resist pattern 4a as a mask, the etching mask film 3 in the form of the CrN film was dry-etched, thereby forming an etching mask film pattern 3a (see FIG. 2D). In this event, a mixed gas of oxygen and chlorine ($O_2$:$Cl_2$=1:4) was used as a dry etching gas.

Then, the remaining resist pattern 4a was removed by ashing or the like. Then, using the etching mask film pattern 3a as a mask, the light-shielding film 2 was dry-etched, thereby forming a light-shielding film pattern 2a (see FIG. 2E). In this event, a mixed gas of $SF_6$ and He was used as a dry etching gas.

Figure 2F:
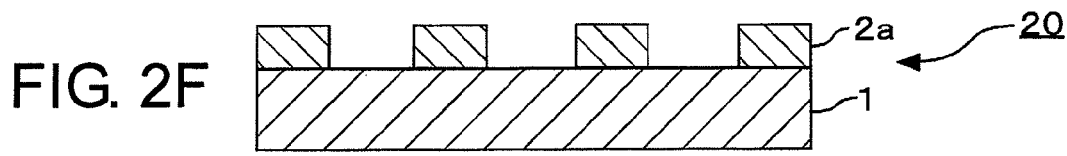

Finally, the etching mask film pattern 3a was removed using a mixed gas of oxygen and chlorine ($O_2$:$Cl_2$=1:4) (see FIG. 2F).

In the manner described above, a binary transfer mask 20 was obtained (see FIG. 2F).

Then, a $XeF_2$ gas as a fluorine-containing substance was supplied to a program defect portion (a black defect portion where the light-shielding film remained) of the binary transfer mask 20 and, further, an electron beam (5.0 keV) was irradiated thereto, thereby carrying out EB defect correction for removing the black defect portion by etching. In the EB defect correction, the ratio of the etching rate of the lower layer to that of the upper layer was 1.45 and thus was in the range of 1.0 to 5.0.

As a result of the EB defect correction, the black defect was satisfactorily corrected without the occurrence of a disadvantage such as an undercut of the lower layer.

Then, the optical properties of the obtained binary transfer mask 20 were measured by a spectrophotometer (SolidSpec-3700DUV: manufactured by Shimadzu Corporation). As a result, the optical density of the light-shielding film 2 for ArF exposure light was 3.0 or more and thus the light-shielding performance was sufficient for a binary transfer mask. Further, the front-surface reflectance and the back-surface reflectance of the light-shielding film 2 for ArF exposure light were 18.6% and 30.0%, respectively, which are values that do not affect pattern transfer.

Then, using the obtained binary transfer mask 20, a transfer pattern was exposed and transferred to a resist film on a semiconductor wafer as a transfer object. An exposure apparatus was of the immersion type with annular illumination using an ArF excimer laser as a light source. Specifically, by setting the binary transfer mask 20 on a mask stage of the exposure apparatus, a transfer pattern was exposed and transferred to an ArF immersion exposure resist film formed on a semiconductor wafer. Then, the exposed resist film was developed, thereby forming a resist pattern. Then, using the resist pattern, a circuit pattern including a L&S pattern of DRAM half-pitch (hp) 45 nm was formed on the semiconductor wafer.

The obtained circuit pattern on the semiconductor wafer was observed using a transmission electron microscope (TEM). As a result, the circuit pattern fully satisfied the specification of a L&S pattern of DRAM half-pitch (hp) 45 nm. That is, it was confirmed that the binary transfer mask of this Example was fully able to transfer a circuit pattern including a L&S pattern of DRAM half-pitch (hp) 45 nm onto a semiconductor wafer.

Comparative Example

In a single-wafer sputtering apparatus, using a mixed target of molybdenum (Mo) and silicon (Si) (at % ratio Mo:Si=11:89) as a sputtering target, reactive sputtering (DC sputtering) was carried out in a mixed gas atmosphere of argon and nitrogen, thereby forming a MoSiN film (lower layer (light-shielding layer)) to a thickness of 40 nm on a transparent substrate 1 made of synthetic quartz glass. Then, using a Mo/Si target (at % ratio Mo:Si=4:96), reactive sputtering (DC sputtering) was carried out in a mixed gas atmosphere of argon, oxygen, and nitrogen, thereby forming a MoSiON film (upper layer (front-surface antireflection layer)) to a thickness of 10 nm on the MoSiN film. In this manner, there was formed a light-shielding film 2 (total thickness: 50 nm) for ArF excimer laser light (wavelength: 193 nm) having a laminated structure comprising the MoSiN film (composition ratio Mo: 9.9 at %, Si: 82.3 at %, N: 7.8 at %) and the MoSiON film (composition ratio Mo: 2.6 at %, Si: 57.1 at %, O: 15.9 at %, N: 24.4 at %). The optical density (OD) of the light-shielding film 2 was 3.0 at the wavelength of ArF excimer laser exposure light.

Then, in the same manner as in the above-mentioned Example, the light-shielding film 2 was annealed and then an etching mask film 3 was formed on an upper surface of the light-shielding film 2, thereby obtaining a binary mask blank. Further, in the same manner as in the above-mentioned Example, a binary transfer mask was manufactured using this mask blank.

Then, in the same manner as in the above-mentioned Example, a $XeF_2$ gas as a fluorine-containing substance was supplied to a program defect portion (a black defect portion where the light-shielding film remained) of this binary transfer mask and, further, an electron beam (5.0 keV) was irradiated thereto, thereby carrying out EB defect correction for removing the black defect portion by etching. Water (vapor) was supplied while etching the lower layer to properly reduce the etching rate of the lower layer. In the EB defect correction, the ratio of the etching rate of the lower layer to that of the upper layer was 21.8 and thus was outside the range of 1.0 to 5.0.

As a result of the EB defect correction, even a portion, which should not be corrected, was etched so that a disadvantage such as an undercut of the lower layer occurred. As a consequence, it was not possible to satisfactorily correct only the black defect portion, thus causing a new defect.

Then, in the same manner as in the above-mentioned Example, using the obtained binary transfer mask of the Comparative Example, a transfer pattern was exposed and transferred to a resist film on a semiconductor wafer as a transfer object, and then a circuit pattern was formed on the semiconductor wafer. The circuit pattern formed on the semiconductor wafer was observed using a transmission electron microscope (TEM). As a result, many short-circuit portions and open-circuit portions were found particularly at a L&S pattern portion and thus the circuit pattern did not satisfy the specification of a L&S pattern of DRAM half-pitch (hp) 45 nm.

While this invention has been described with reference to the embodiment, the technical scope of the invention is not limited to the scope of the description of the above-mentioned embodiment. It is obvious to a person skilled in the art that various changes or improvements can be added to the above-mentioned embodiment. It is clear from the description of claims that the modes added with such changes or improvements can also be included in the technical scope of this invention

What is claimed is:

1. A mask blank for manufacturing a transfer mask adapted to be applied with ArF excimer laser exposure light, comprising:
   a transparent substrate; and
   a light-shielding film formed on the transparent substrate where the light-shielding film is to be formed into a transfer pattern;
   wherein the light-shielding film has at least two-layers comprising a lower layer and an upper layer from a transparent substrate side,
   the lower layer is composed mainly of a first material containing a transition metal, silicon, and nitrogen,
   the upper layer is composed mainly of a second material containing a transition metal, silicon, and nitrogen, and
   a ratio of a first etching rate of the lower layer to a second etching rate of the upper layer is 1.0 or more and 5.0 or less in etching carried out by supplying a fluorine-containing substance onto a target portion and irradiating charged particles to the target portion,
   wherein a ratio obtained by dividing a content of the transition metal in the lower layer by a total content of the transition metal and the silicon in the lower layer and a nitrogen content in the lower layer are in ranges satisfying a first condition of the following formula $$C_N \geq -0.00526 C_{Mo}^2 - 0.640 C_{Mo} + 26.624$$

where $C_{Mo}$ is a ratio obtained by dividing the content of the transition metal in the lower layer by the total content of the transition metal and the silicon in the lower layer, and where $C_N$ is a nitrogen content in the lower layer.

2. The mask blank according to claim 1, wherein the lower layer is substantially free of oxygen and the upper layer is substantially free of oxygen at a portion excluding a surface layer of the upper layer.

3. The mask blank according to claim 1, wherein a difference between a first nitrogen content in the upper layer and a second nitrogen content in the lower layer is less than 30 at %.

4. The mask blank according to claim 1, wherein a difference between a first ratio obtained by dividing a first content of the transition metal in the lower layer by a first total content of the transition metal and the silicon in the lower layer and a second ratio obtained by dividing a second content of the transition metal in the upper layer by a second total content of the transition metal and the silicon in the upper layer such that this difference is 4% or less.

5. The mask blank according to claim 1, further wherein the ratio obtained by dividing the content of the transition metal in the lower layer by the total content of the transition metal and the silicon in the lower layer and the nitrogen content in the lower layer are in ranges simultaneously satisfying a second condition of the following formula $$C_N \leq -3.63 \times 10^{-7} C_{Mo}^5 + 7.60 \times 10^{-5} C_{Mo}^4 - 4.67 \times 10^{-3} C_{Mo}^3 + 5.06 \times 10^{-2} C_{Mo}^2 + 2.082 C_{Mo} + 1.075$$

where $C_{Mo}$ is a ratio obtained by dividing the content of the transition metal in the lower layer by the total content of the transition metal and the silicon in the lower layer, and where $C_N$ is a nitrogen content in the lower layer.

6. The mask blank according to claim 1, wherein a content of the transition metal in the upper layer is 10 at % or less.

7. The mask blank according to claim 1, wherein a ratio obtained by dividing a content of the transition metal in the lower layer by a total content of the transition metal and the silicon in the lower layer is 15% or less.

8. The mask blank according to claim 1, wherein an etching mask film is provided on an upper surface of the light-shielding film and wherein the etching mask film contains chromium and at least one of nitrogen and oxygen, and further wherein a content of the chromium is 50 at % or more in the etching mask film.

9. A method of manufacturing a transfer mask using the mask blank according to claim 1, comprising a defect correction step of making a comparison between a design transfer pattern and a transfer pattern formed in the light-shielding film and etching a defect portion, where the light-shielding film remains, by supplying a fluorine-containing substance and irradiating charged particles.

10. A method of manufacturing a semiconductor device, comprising forming a circuit pattern on a semiconductor wafer using the transfer mask manufactured by the method according to claim 9.

11. A transfer mask adapted to be applied with ArF excimer laser exposure light, comprising:
    a transparent substrate; and
    a light-shielding film formed on the transparent substrate, the light-shielding film comprising a transfer pattern;
    wherein the light-shielding film has at least two-layers comprising a lower layer and an upper layer from a transparent substrate side,
    the lower layer is composed mainly of a first material containing a transition metal, silicon, and nitrogen,
    the upper layer is composed mainly of a second material containing a transition metal, silicon, and nitrogen, and
    a ratio of a first etching rate of the lower layer to a second etching rate of the upper layer is 1.0 or more and 5.0 or less in etching carried out by supplying a fluorine-containing substance onto a target portion and irradiating charged particles to the target portion.
    wherein a ratio obtained by dividing a content of the transition metal in the lower layer by a total content of the transition metal and the silicon in the lower layer and a nitrogen content in the lower layer are in ranges satisfying a first condition of the following formula $$C_N \geq -0.00526 C_{Mo}^2 - 0.640 C_{Mo} + 26.624$$

where $C_{Mo}$ is a ratio obtained by dividing the content of the transition metal in the lower layer by the total content of the transition metal and the silicon in the lower layer, and where $C_N$ is a nitrogen content in the lower layer.

12. The transfer mask according to claim 11, wherein the lower layer is substantially free of oxygen and the upper layer is substantially free of oxygen at a portion excluding a surface layer of the upper layer.

13. The transfer mask according to claim 11, wherein a difference between a first nitrogen content in the upper layer and a second nitrogen content in the lower layer is less than 30 at %.

14. The transfer mask according to claim 11, wherein a difference between a first ratio obtained by dividing a first content of the transition metal in the lower layer by a first total content of the transition metal and the silicon in the lower layer and a second ratio obtained by dividing a second content of the transition metal in the upper layer by a second total content of the transition metal and the silicon in the upper layer such that this difference is 4% or less.

15. The transfer mask according to claim 11, further wherein the ratio obtained by dividing the content of the transition metal in the lower layer by the total content of the transition metal and the silicon in the lower layer and the nitrogen content in the lower layer are in ranges simultaneously satisfying a second condition of the following formula $$C_N \le -3.63 \times 10^{-7} C_{Mo}^5 + 7.60 \times 10^{-5} C_{Mo}^4 - 4.67 \times 10^{-3} C_{Mo}^3 + 5.06 \times 10^{-2} C_{Mo}^2 + 2.082 C_{Mo} + 1.075$$

where $C_{Mo}$ is a ratio obtained by dividing the content of the transition metal in the lower layer by the total content of the transition metal and the silicon in the lower layer, and where $C_N$ is a nitrogen content in the lower layer.

16. The transfer mask according to claim 11, wherein a content of the transition metal in the upper layer is 10 at % or less.

17. The transfer mask according to claim 11, wherein a ratio obtained by dividing a content of the transition metal in the lower layer by a total content of the transition metal and the silicon in the lower layer is 15% or less.

18. A method of manufacturing a semiconductor device, comprising forming a circuit pattern on a semiconductor wafer using the transfer mask according to claim 11.

* * * * *